(12) United States Patent
Roshay

(10) Patent No.: US 10,937,472 B2
(45) Date of Patent: Mar. 2, 2021

(54) SYSTEM FOR ACCLIMATING A HORSE TO THE SOUND OF AN ARENA CHUTE GATE AND METHOD OF USE OF THE SAME

(71) Applicant: Greg Roshay, San Tan Valley, AZ (US)

(72) Inventor: Greg Roshay, San Tan Valley, AZ (US)

(*) Notice: Subject to any disclaimer, the term of this patent is extended or adjusted under 35 U.S.C. 154(b) by 0 days.

(21) Appl. No.: 16/707,110

(22) Filed: Dec. 9, 2019

(65) Prior Publication Data

US 2020/0202911 A1 Jun. 25, 2020

Related U.S. Application Data

(60) Provisional application No. 62/782,003, filed on Dec. 19, 2018.

(51) Int. Cl.
*G11C 7/16* (2006.01)
*A01K 1/06* (2006.01)
*G06F 3/16* (2006.01)
*A01K 15/02* (2006.01)

(52) U.S. Cl.
CPC .............. *G11C 7/16* (2013.01); *A01K 1/0613* (2013.01); *A01K 15/02* (2013.01); *G06F 3/165* (2013.01)

(58) Field of Classification Search
CPC ........ G11C 7/16; A01K 1/0613; A01K 15/02; A01K 15/021; G06F 3/165
See application file for complete search history.

(56) References Cited

U.S. PATENT DOCUMENTS

| 7,331,310 B1* | 2/2008 | Sersland | A01K 15/021 119/712 |
| 7,703,415 B2* | 4/2010 | Gentry | A01K 15/003 119/427 |
| 10,178,854 B1* | 1/2019 | Lawson | A01K 15/02 |
| 2009/0164902 A1* | 6/2009 | Cohen | G10H 1/0025 715/716 |
| 2013/0326959 A1* | 12/2013 | Gipson | A01K 1/0613 49/357 |
| 2017/0033581 A1* | 2/2017 | Horii | H04B 5/0037 |

* cited by examiner

*Primary Examiner* — Quan-Zhen Wang
*Assistant Examiner* — Mancil Littlejohn, Jr.
(74) *Attorney, Agent, or Firm* — Schmeiser, Olsen & Watts LLP

(57) ABSTRACT

A system for acclimating a horse to the sound of opening a chute gate of a rodeo arena in a timed chase event is disclosed. The system includes an arena with a chute gate, a recording and playback device, at least one speaker, and a controller. In use, a horse-mounted rider is contained within a box at the side of the chute. The horse has incorrectly associated the sound of the gate with beginning chase. The recording and playback device records the sound of the opening of the gate, which may be played back for the horse to hear within the box. Upon hearing the sound, the rider holds back the horse to prevent giving chase. Repeated use acclimates the horse to the sound and teaches the horse to wait for the rider's cue to begin chase. A method of use is also disclosed.

5 Claims, 4 Drawing Sheets

SYSTEM FOR ACCLIMATING A HORSE TO THE SOUND OF AN ARENA CHUTE GATE AND METHOD OF USE OF THE SAME

CROSS REFERENCE TO RELATED APPLICATION

This application claims priority to U.S. Provisional Patent Application to Greg Roshay entitled "SYSTEM FOR ACCLIMATING A HORSE TO THE SOUND OF AN ARENA CHUTE GATE AND METHOD OF USE OF THE SAME," Ser. No. 62/782,003, filed Dec. 19, 2018, the disclosures of which are hereby incorporated entirely herein by reference.

BACKGROUND OF THE INVENTION

Technical Field

This invention relates generally to animal training systems and particularly to a system for acclimating a horse to the sound of a gate of a chute of a rodeo arena.

State of the Art

Some popular timed chase rodeo events, including team roping, calf roping, breakaway roping, and steer wrestling, feature a steer or a calf (hereinafter collectively referred to as a "steer") and one or two horse-mounted riders. Steers are moved through narrow fenced pathways of a rodeo arena, leading to a chute with a spring-loaded gate. On each side of the chute is a generally rectangular partially-fenced area known as a "box" that contains a mounted rider. When ready to start, the main rider will "call" for the steer by nodding his head, signaling a chute worker to trip a lever opening the front double gate. The suddenly freed steer then breaks out running and the riders give chase.

Some horses begin to associate the sound of the opening of the gate with beginning chase, rather than waiting for cue from the rider to begin. Such horses will often jump or lurch forward in anticipation, resulting in a penalty known as "breaking the barrier."

Conventional training techniques, for training a horse to wait for cue from the rider, involve releasing (or "scoring") a steer, or opening and closing the gate, while holding the horse back without giving chase. These techniques may involve expensive equipment or extra steers, subject gates to unnecessary wear and tear, and take up valuable practice time.

Accordingly, what is needed is a horse training system for acclimating a horse to the sound of the opening of a chute gate, that is inexpensive, easy to use, not subjecting a chute gate to unnecessary wear and tear, and not requiring scoring of a steer.

SUMMARY OF THE INVENTION

The present invention relates to animal training systems and particularly to a system for acclimating a horse to the sound of the opening of a gate of a chute of a rodeo arena.

Embodiments of a system for acclimating a horse to the sound of the opening of an arena chute gate comprise an arena, a recording and playback device, at least one speaker, and a controller.

In some embodiments, an arena further comprises a chute with a gate operatively coupled to the front of the chute, and at least one box adjacent the chute on a side of the chute. The chute is configured to contain a steer for use in a timed chase rodeo event, the steer being further contained by the gate coupled to the chute. An audible sound is created by the gate upon opening of the gate by a user. The at least one box is a generally rectangular partially-fenced area for containing a horse-mounted rider in a timed chase rodeo event.

In some embodiments, a recording and playback device comprises a microphone, an analog-to-digital converter (hereinafter "ADC") communicatively coupled to the microphone, a digital signal processor (hereinafter "DSP") communicatively coupled to the ADC, a memory communicatively coupled to the DSP, and a digital-to-analog converter (hereinafter "DAC") communicatively coupled to the DSP. Embodiments of the present invention further comprise at least one speaker communicatively coupled to the DAC and a controller communicatively coupled to the DSP.

The microphone is preferably disposed near the gate, such that the microphone may capture the sound of the opening of the gate. The at least one speaker is disposed near the box, such that sounds emanating from the speaker may be heard by a horse contained within the box.

The DSP may be programmed to perform the following steps: receive a signal from the analog-to-digital converter containing a digital conversion of a sound of the gate captured by the microphone and transmitted to the analog-to-digital converter, in response to user input to the controller to record the sound of the gate; encode and save the signal to the memory as a digital recording; retrieve the signal from the memory in response to user input to the controller to play the sound of the gate; and send the signal to the digital-to-analog converter, whereupon an analog conversion of the signal is transmitted from the digital-to-analog converter to the speaker and broadcast to the box by the speaker.

In response to user input to the controller, the DSP may retrieve the digital signal containing the sound from the memory and send the signal to the DAC. The DAC converts the digital signal to an audio signal and sends the audio signal to the speaker. The speaker then broadcasts the sound to an area at least encompassing the box containing a horse, wherein the horse hears the played-back sound of the opening of the gate. The sound may be played-back repeatedly in response to user input to the controller. The rider will hold back and restrain the horse to prevent the horse from beginning chase. A horse that is thereby acclimated to the played-back sound of the opening of the gate is better suited to begin chase, in a timed chase event, only upon receiving the rider's cue, rather than upon hearing the sound of the actual gate being opened.

In embodiments of a second aspect of the invention, the recording and playback device is configured to record other arena sounds, other than the sound of the opening of a chute gate, that a horse may hear during timed events. The device may begin recording in response to user input to the controller, or, in some embodiments, in response to the horse running through an electronic eye. Recorded sounds may be played back for the horse to hear during practice of timed events, in response to user input to the controller, or, in some embodiments, in response to the horse running through an electronic eye.

A method of using a system for acclimating a horse to the sound of the opening of an arena chute gate is also disclosed.

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF EMBODIMENTS OF THE INVENTION

Figure 1:
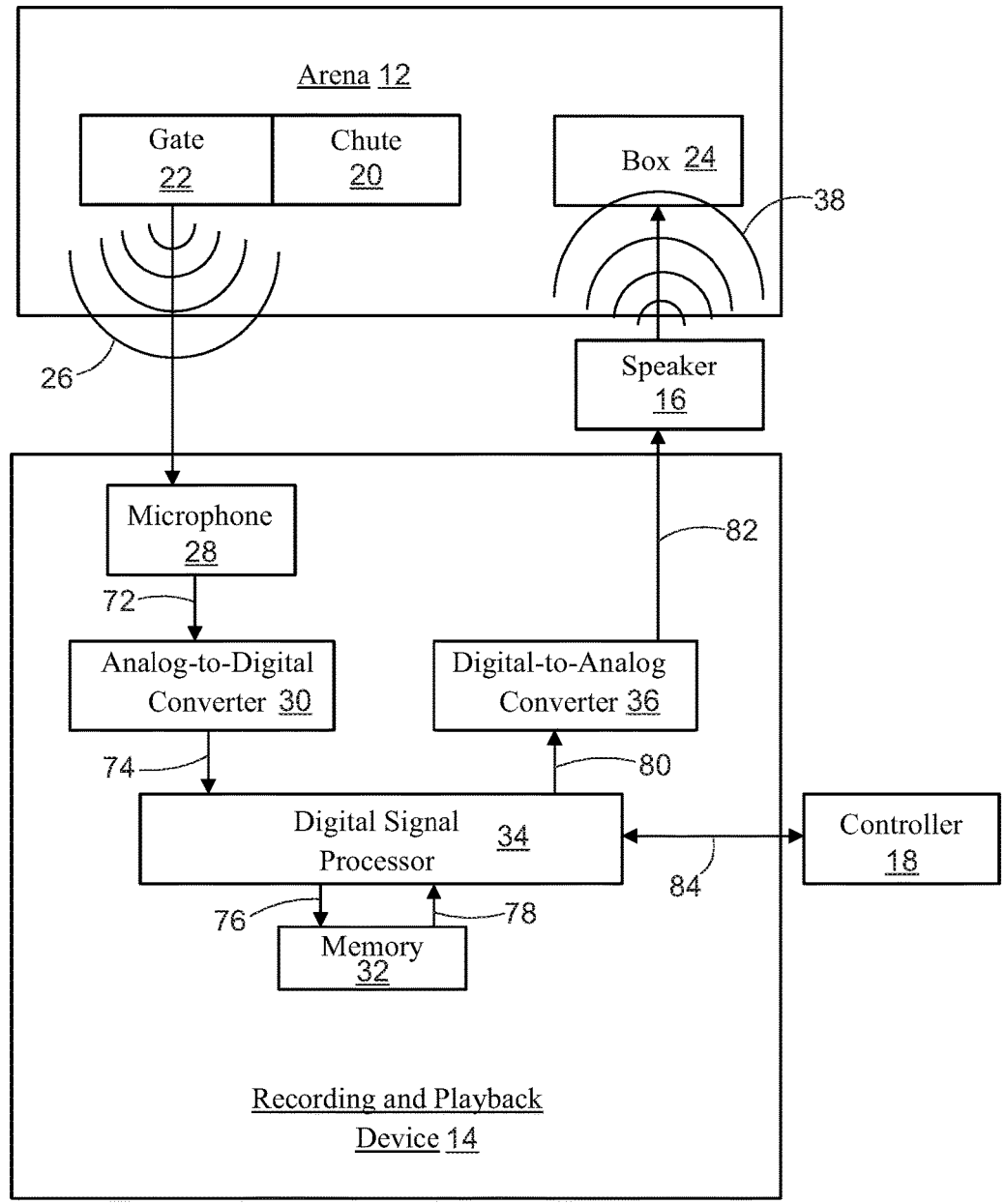
FIG. 1 is a diagrammatic view of a system for acclimating a horse to the sound of the opening of an arena chute gate in accordance with an embodiment.

As discussed above, embodiments of the present invention relate to animal training systems and particularly to a system for acclimating a horse to the sound of the opening of a gate of a chute of a rodeo arena. The system is used to teach a horse, in a timed chase event, not to begin chase at the sound of the opening of the gate of the chute, but, rather, to wait for the rider's cue to begin chase.

As briefly described above, some popular timed chase rodeo events, including team roping, calf roping (also known as "tie-down roping"), breakaway roping, and steer wrestling (also known as "bulldogging"), feature a steer or a calf (hereinafter collectively referred to as a "steer") and one or two horse-mounted riders. Steers are moved through narrow fenced pathways of a rodeo arena (also commonly known as a "roping arena", hereinafter collectively referred to as an "arena"), leading to a chute with spring-loaded gates. One steer is loaded into the chute, the conventional chute having a front double gate closed in front of the steer, and a rear gate closed behind the steer.

On each side of the chute is a generally rectangular partially-fenced area known as a "box". In each box is a mounted rider, who may be a roper, a hazer, or a bulldogger, depending on the event. In any case, the rider backs and settles his horse into the back corner of the box until ready to start. When ready, the roper or bulldogger will "call" for the steer by nodding his head, signaling a chute worker to trip a lever opening the front double gate. The suddenly-freed steer then breaks out running and the riders give chase.

A barrier rope, fastened around the steer's neck, is used to ensure the steer gets a head start. The length of the barrier rope is generally determined by the length of the arena. Another rope known as a barrier is stretched across the front of the box. The lead end of the barrier is secured by an easily-breakable string and the tail end of the barrier is coupled to an elastic cord or spring, keeping the barrier taut. A brightly-colored flag, usually orange or red in color, is attached to the middle of the barrier. When the steer reaches the end of the barrier rope, the barrier rope pops off and simultaneously releases the barrier, which snaps back, allowing the rider to freely exit the box, giving chase. When the barrier snaps back, the sudden motion of the flag attached thereto signals a timekeeper to begin timing of the event. If the rider exits the box too soon, the rider's horse will engage the barrier and the string will be broken—an occurrence known as "breaking the barrier." Breaking the barrier may result in a 5- or 10-second penalty being added to the rider's time in the event.

Riders who participate in such events often spend significant time and effort in practice and training in order to better time the exit from the box. The objective is to exit the box as soon as possible after the steer is released, without breaking the barrier. Riders train their horses to begin chase on cue from the rider, typically upon release of the reins and a simultaneous kick of the heels to the sides of the horse.

An existing problem is that horses who train repeatedly often begin to associate beginning chase with the sound of the opening of the front gate of the chute. Such horses will often begin to anticipate giving chase at the sound of the opening of the gate, rather than on cue from the rider, resulting in breaking the barrier.

Riders employ various training techniques to teach their horses to remain settled in the box and wait for the rider's cue to begin chase, rather than bolting at the sound of the gate. One such conventional technique is called "scoring" a steer, which refers to releasing a steer from the chute while holding the horse back and refraining from giving chase, even though the horse has heard the sound of the opening gate. Repeatedly scoring a steer may cause the horse to eventually disassociate beginning chase with the sound of the opening gate. However, repeatedly scoring steers requires a large number of steers, which are released unchased, and must be rounded up again to continue practice. Scoring steers and rounding them up again requires significant extra effort and is an inefficient use of valuable practice time. Many participants, arena owners or other stock providers don't have large numbers of steers to practice with and scoring a steer precludes using that steer for practicing the actual event.

Employing another technique, some conventional chutes are equipped with two front double gates. The rider may signal for the first of the two front gates to be opened, thereby exposing the horse to the sound of the opening gate, without releasing the steer, the steer being restrained by the second of the two front gates. The rider holds the horse back to remain settled in the box until calling for the steer, upon which the second of the two front gates is opened, the steer is released, and the horse gives chase on cue from the rider. Hearing the sound of the first gate, without giving chase, similarly desensitizes the horse to the sound of the gate. However, such gates are often more expensive, complicated to use, and subject to significant wear and tear.

Disclosed, is a horse training system for acclimating a horse to the sound of the opening of a chute gate, that is inexpensive, easy to use, not subjecting a chute gate to unnecessary wear and tear, and not requiring scoring of a steer.

Referring to the drawings, as shown in FIG. 1, embodiments of a system 10 for acclimating a horse to the sound of the opening of an arena chute gate comprise an arena 12, a recording and playback device 14, at least one speaker 16, and a controller 18.

In some embodiments, as shown in FIG. 1, an arena 12 further comprises a chute 20 with a gate 22 operatively coupled to the front of the chute 20, and at least one box 24 adjacent the chute 20 on a side of the chute 20. In some embodiments, an arena 12 may further comprise at least one holding pen (not shown), for holding steers, and narrow fenced pathways (not shown) leading to the chute 20. The chute 20 is configured to contain a steer for use in a timed chase rodeo event, the steer being further contained by the gate 22 coupled to the chute. In some embodiments, an arena further comprises a rear gate (not shown) operatively coupled to the rear of the chute 20. The gate 22 is configured to rotate between a closed orientation and an open orientation. In some embodiments, the gate 22 is spring-loaded, wherein the gate 22 is maintained in the closed orientation by a lever mechanism (not shown) and springs open suddenly upon release of the lever mechanism by a user. In some embodiments, the gate 22 may be opened automatically by a user with a remote-control device. In some embodiments the remote-control device may be the controller 18. In some embodiments, the gate 22 is not spring-loaded, but may be opened by force of the user opening the gate 22 manually. The various means of opening the gate 22, as described herein, are not intended to be limiting. It is understood that the gate 22 may be opened by any of a variety of means, including the use of levers, catches, springs, clasps, pins, latches, ropes, cables, and the like, or any combination thereof. In some embodiments, an arena 12 comprises more than one gate 22 operatively coupled to the chute 20.

The at least one box 24 is a generally rectangular partially-fenced area for containing a horse-mounted rider in a timed chase rodeo event. In some embodiments, an arena 12 comprises two boxes 24, one of the two boxes 24 being disposed adjacent the chute 20 on one side of the chute 20 and the other of the two boxes 24 being disposed adjacent the chute 20 on the opposing side of the chute 20. In embodiments of the present invention, an audible sound 26, depicted by the curved lines emanating from the gate in FIG. 1, is created by the gate 22 upon opening of the gate 22 by a user.

In some embodiments, as shown in FIG. 1, a recording and playback device 14 comprises a microphone 28, an ADC 30 communicatively coupled to the microphone 28 via communication link 72, a DSP 34 communicatively coupled to the ADC 30 via communication link 74, a memory 32 communicatively coupled to the DSP 34 via communication links 76 and 78, and a DAC 36 communicatively coupled to the DSP 34 via communication link 80. Embodiments of the present invention further comprise at least one speaker 16 communicatively coupled to the DAC 36 via communication link 82 and a controller 18 communicatively coupled to the DSP 34 via communication link 84. Communication links 72, 74, 76, 78, 80, 82, and 84 may be wired or wireless communication links.

In some embodiments, the recording and playback device 14 may be coupled to a component of the arena 12. For example, the recording and playback device 14 may be coupled to the chute 20, to the box 24, to any of the narrow, fenced pathways (not shown), or to any other component of the arena 12. In some embodiments, the recording and playback device 14 may be held in the hand of a user. The recording and playback device 14 may be configured to be attached to a user's clothing or contained within a pouch that is configured to be attached to a user's clothing. For example, the recording and playback device 14 may be contained within a pouch that is worn on the belt of a user (not shown).

In some embodiments, the microphone 28 may be integrated into the recording and playback device 14. In other embodiments, the microphone 28 may be separate from the recording and playback device 14. In any case, the microphone 28 is preferably disposed near the gate 22, such that the microphone 28 may capture the sound 26 of the opening of the gate 22. In some embodiments, for example, the microphone 28 may be coupled to the chute 20; to the box 24; to any of the narrow, fenced pathways; or to any other component of the arena 12; provided that the microphone 28 is disposed within range of the sound 26 of the opening of the gate 22, in order to capture the sound 26 of the opening of the gate 22.

In some embodiments, the at least one speaker 16 may be integrated into the recording and playback device 14. In other embodiments, the at least one speaker 16 may be separate from the recording and playback device 14. In any case, any of the at least one speaker 16 is disposed near the box 24, such that sounds 38 emanating from the speaker 22, depicted in FIG. 1 as curved lines 38 emanating from the speaker 22, may be heard by a horse contained within the box 24. In some embodiments, for example, the speaker 16 may be coupled to the chute 20, to the box 24, to any of the narrow, fenced pathways, or to any other component of the arena 12, provided that the speaker 16 is disposed within a range of the box 24 such that a horse contained within the box 24 can hear the sounds 38 emanating from the speaker 22.

In some embodiments, the controller 18 may be integrated into the recording and playback device 14. In other embodiments, the controller 18 may be separate from the recording and playback device 14. In some embodiments, for example, the controller 18 may be held in the hand of a user. The controller 18 may be configured to be attached to a user's clothing or contained within a pouch that is configured to be attached to a user's clothing. For example, the controller 18 may be contained within a pouch that is worn on the belt of a user. In some embodiments, communication link 84 may be through any type of network, including a local area network (LAN) or a wide area network (WAN), or the connection may be made through the Internet or through a Bluetooth connection. In some embodiments, the controller 18 is a mobile computing device, such as a cell phone, a tablet, or the like.

Figure 2:
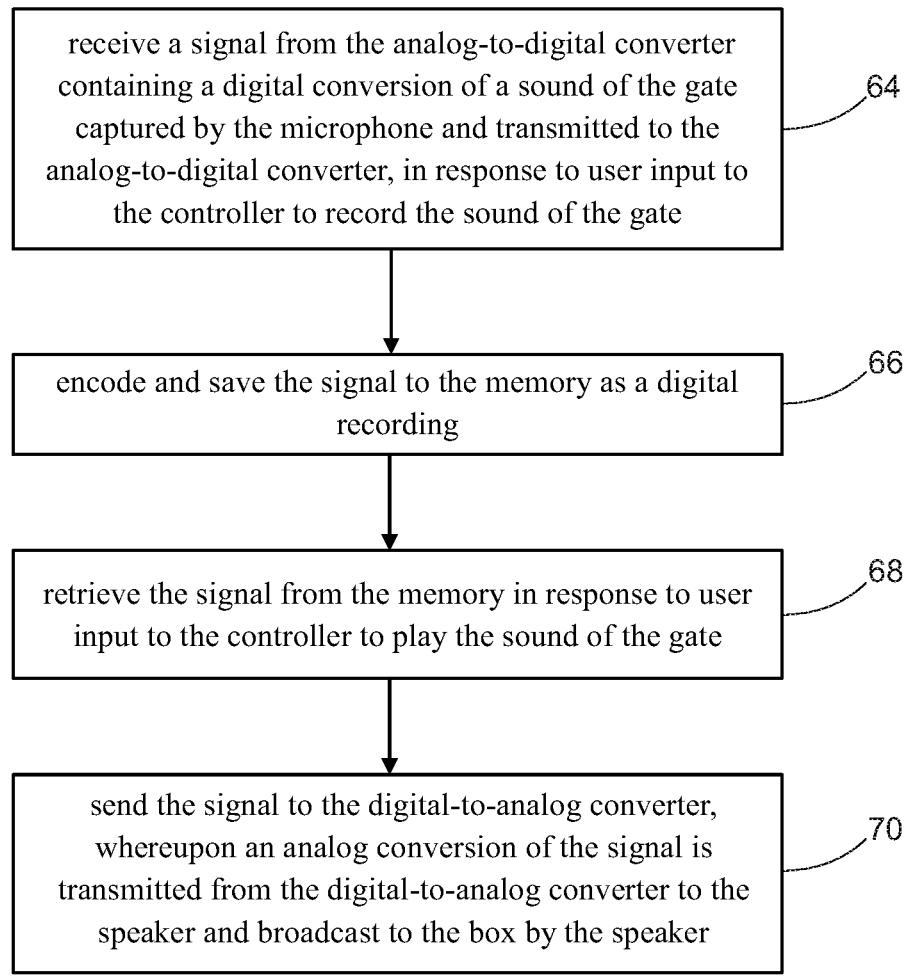
FIG. 2 is a flow chart of programmed steps of a digital signal processor of a system for acclimating a horse to the sound of the opening of an arena chute gate in accordance with an embodiment.

The DSP 34 may be programmed to perform the following steps, as shown in FIG. 2: receive a signal from the analog-to-digital converter containing a digital conversion of a sound of the gate captured by the microphone and transmitted to the analog-to-digital converter, in response to user input to the controller to record the sound of the gate [Step 64]; encode and save the signal to the memory as a digital recording [Step 66]; retrieve the signal from the memory in response to user input to the controller to play the sound of the gate [Step 68]; and send the signal to the digital-to-analog converter, whereupon an analog conversion of the signal is transmitted from the digital-to-analog converter to the speaker and broadcast to the box by the speaker [Step 70].

In operation of embodiments of the present invention, the DSP 34 begins recording mode in response to user input to the controller 18. The DSP 34 may remain in recording mode for a predetermined period of time. For example, the DSP 34 may remain in recording mode for a period of 10 seconds, 15 seconds, 30 seconds, 1 minute, 2 minutes, or any other period of time that is suitable for recording the sound 26 of the opening of the gate 22. In some embodiments, the DSP 34 may remain in recording mode until recording mode is ended in response to further user input to the controller 18.

While the DSP 34 is in recording mode, a user opens the gate 22, which generates a sound 26 of the opening of the gate 22. The sound 26 is captured by the microphone 28. An analog signal containing the sound is sent from the microphone 28 to the ADC 30, which converts the analog signal to a digital signal that is sent to the DSP 34. The DSP 34 then encodes and creates a digital recording and stores the digital recording to the memory 32.

In response to user input to the controller 18, the DSP 34 may retrieve the digital recording containing the sound from the memory 32 and send the signal to the DAC 36. The DAC 36 converts the digital recording to an audio signal and sends the audio signal to the speaker 16. The speaker 16 then broadcasts the sound 38 to an area at least encompassing the box 24 containing a horse, wherein the horse hears the played-back sound 38 of the opening of the gate 22. The sound 38 may be played-back repeatedly in response to user input to the controller 18.

Initially, a horse that has previously associated the sound 26 of the opening of the gate 22 with beginning chase in a timed chase event may be apt to jump or lurch forward, in anticipation of beginning chase, upon hearing the played-back sound 38 of the opening of the gate 22. The rider, however, will hold back and restrain the horse to prevent the horse from beginning chase. By repeatedly playing back the sound 38 of the opening of the gate 22 in this manner, while holding back the horse, the horse will begin to disassociate the sound 26 of the opening of the gate 22 with beginning chase. With each successive iteration, the horse will remain calmer, until the horse learns to remain still upon hearing the sound 38. A horse that is thereby acclimated to the played-back sound 38 of the opening of the gate 22 is better suited to begin chase, in a timed chase event, only upon receiving the rider's cue, rather than upon hearing the sound 26 of the actual gate 22 being opened.

In some embodiments of the present invention, the recording and playback device 14 may store multiple signals to the memory 32, each signal containing different sounds of the same gate 22 or of various gates being opened. In some embodiments, the DSP 34 may be programmed to repeatedly play back the sound 38. The DSP 34 may repeat playback of the sound 38 at spaced, timed intervals. For example, the DSP 34 may repeatedly play the sound 38 at 10-second, 30-second, 1-minute, 2-minute, or any other suitable timed interval, in accordance with preprogramming of the DSP 34 or user input to the controller 18.

In some embodiments, any of the DSP 34 or the controller 18, or both the DSP 34 and the controller 18, may further comprise a display (not shown) for displaying status information. In some embodiments, the display may be interactive with the user. For example, the display may display a list of various recorded sounds stored in the memory 32, whereby the user may select, from the list, a sound to be played back. In some embodiments, the user may select any of various modes of operation of the recording and playback device 14 from a list displayed on the display. For example, the user may select record mode, end record, and playback. In some embodiments, the display may also display information related to adjustable sensitivity of the microphone or volume of the speaker, which may each be controlled by user input to the controller 18.

In some embodiments, a system 10 for acclimating a horse to the sound of the opening of an arena chute gate 22 comprises a recording and playback device 14 configured to be coupled to an arena 12, at least one speaker 16 configured to be coupled to the arena 12 and communicatively coupled to the recording and playback device 14, and a controller 18 communicatively coupled to the recording and playback device 14. In such embodiments, the recording and playback device 14 may comprise a microphone 28, an analog-to-digital converter 30 communicatively coupled to the microphone 28, a digital signal processor 34 communicatively coupled to the analog-to-digital converter 30, a memory 32 communicatively coupled to the digital signal processor 34, and a digital-to-analog converter 36 communicatively coupled to the digital signal processor 34. The at least one speaker 16 may be configured to be coupled to the arena 12 and communicatively coupled to the recording and playback device 14. The digital signal processor 34 may be programmed to: receive a signal from the analog-to-digital converter 30 containing a digital conversion of a sound 26 of the chute gate 22 of the arena 12, captured by the microphone 28 and transmitted to the analog-to-digital converter 30, in response to user input to the controller 18 to record the sound 26 of the gate 22; encode and save the signal to the memory 32 as a digital recording; retrieve the signal from the memory 32 in response to user input to the controller 18 to play the sound 26 of the gate 22; and send the signal to the digital-to-analog converter 36, whereupon an analog conversion of the signal is transmitted from the digital-to-analog converter 36 to the at least one speaker 16 and broadcast to the arena box 24 by the at least one speaker 16.

In some embodiments, the microphone 28, the at least one speaker 16, the controller 18, or any combination of the microphone 28, the at least one speaker 16, and the controller 18, may be integrated into the recording and playback device 14. In some embodiments, the microphone 28, the at least one speaker 16, the controller 18, or any combination of the microphone 28, the at least one speaker 16, and the controller 18, may be separate from the recording and playback device 14.

Figure 4:
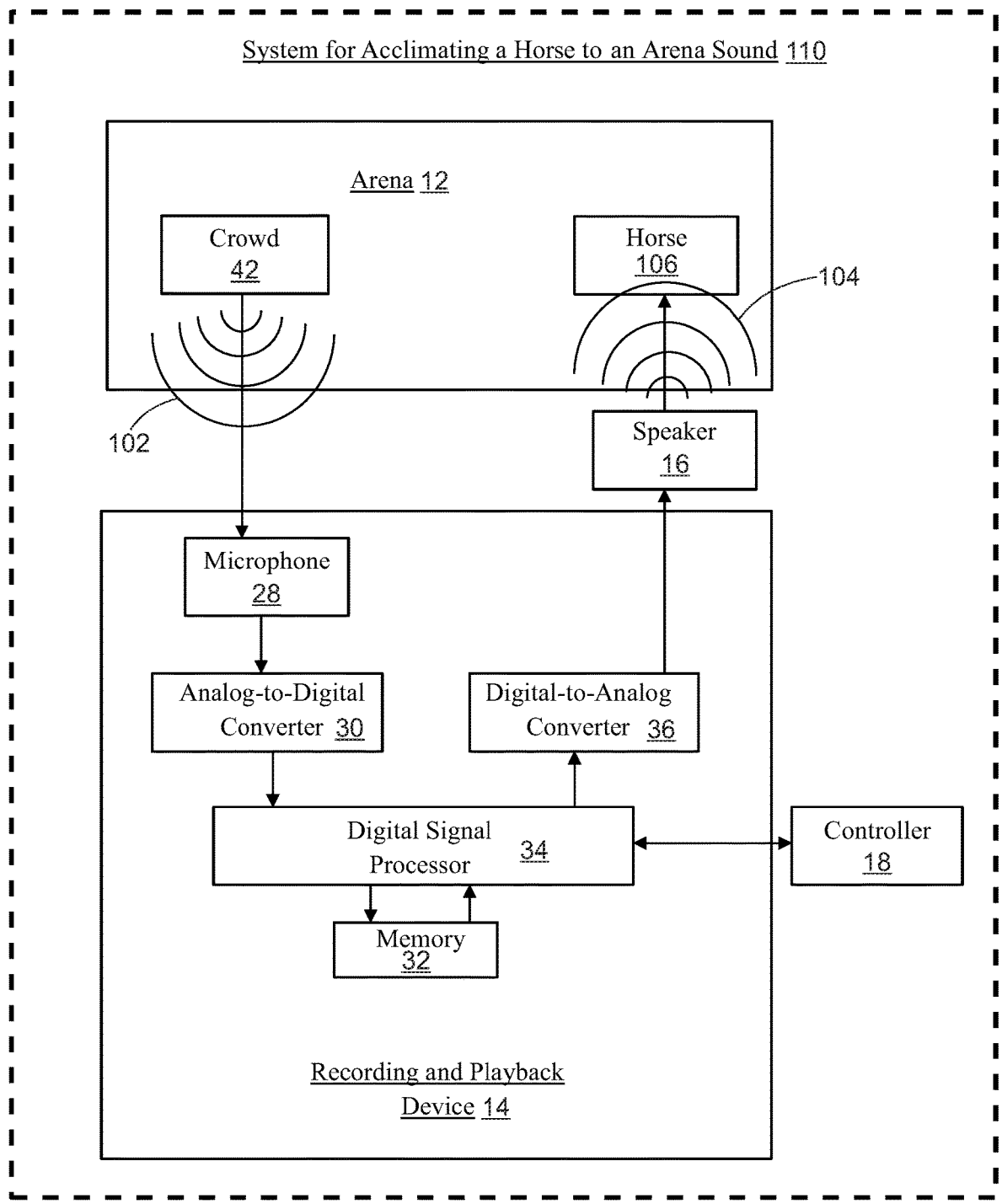
FIG. 4 is a diagrammatic view of a system for acclimating a horse to an arena sound in accordance with an embodiment of a second aspect of the invention.

In a second aspect of the present invention, as shown in FIG. 4, a training system 100 is used to acclimate a horse to other arena sounds, other than the sound of the opening of a chute gate, that the horse may hear during a timed event. A timed event may be a timed chase event, as described above, or it may be another timed event, such as barrel racing, pole bending, cowboy mounted shooting, and the like. For example, during a timed event, a horse may hear the sounds of a crowd cheering, guns firing, announcements broadcast over a loudspeaker, and the like. Often, horses participating in timed events are distracted or spooked by these various sounds during competition, resulting in poor performance of the horse.

In an embodiment, the recording and playback device 14 is configured to capture an arena sound 102 that may be generated during a timed event. In such embodiments, the arena 12 may comprise a source 42 of sound, such as a crowd, a gun, or an announcer with a loudspeaker, or the like, and a horse 106 that is participating in a timed event. For example, in the system 110 for acclimating a horse to an arena sound, shown in FIG. 4, a microphone 28 of a recording and playback device 14 is positioned to capture a sound 102 of a crowd 42 of an arena 12. At least one speaker 16 is positioned to broadcast a playback of the recorded sound 104 such that the horse 106 may hear the played-back sound 104.

In such embodiments, the controller 18 may be integrated into the recording and playback device 14, or it may be separate from the recording and playback device 14. In some embodiments, the controller 18 may comprise, or be integrated into, an electronic eye system (not shown) whereby the DSP 34 begins recording mode in response to the horse 106 running through the electronic eye, at the start of the event. In other embodiments, the controller 18 may be held in the hand of a user, wherein the DSP 34 begins recording mode in response to user input to the controller 18. The DSP 34 may remain in recording mode for a predetermined period of time. For example, the DSP 34 may remain in recording mode for a period of 10 seconds, 15 seconds, 30 seconds, 1 minute, 2 minutes, or any other period of time that is suitable for recording the arena sound 102. Alternatively, the DSP 34 may remain in recording mode until recording mode is ended in response to further user input to the controller 18, or, in embodiments wherein the controller 18 comprises, or is integrated into, an electronic eye, the DSP 34 may remain in recording mode in response to the horse 106 running back through the electronic eye at the end of the event.

In some embodiments, in response to user input to the controller 18, the DSP 34 may retrieve the digital recording containing the sound from the memory 32 and send the signal to the DAC 36. The DAC 36 converts the digital recording to an audio signal and sends the audio signal to the speaker 16. The speaker 16 then broadcasts the sound 38 such that the horse hears the played-back arena sound 104. The sound 104 may be played-back repeatedly in response to user input to the controller 18. In some embodiments, wherein the controller 18 comprises, or is integrated into, an electronic eye, the DSP 34 may retrieve the digital recording and send it to the DAC 36 in response to the horse 106 running through the electronic eye. The sound 104 may be played-back repeatedly in response to user input to the controller 18.

In operation of embodiments of the second aspect of the invention, the recording and playback device 14 records an arena sound 102, or combination of arena sounds 102, during a timed event. Multiple recordings of various arena sounds 102, or combinations thereof, may be thereby stored in the memory 32 of the recording and playback device 14. Then, when a horse 106 is participating in a timed event, a user may select from the various recordings, a recording to be played back through the speaker 16. The horse 106 may thereby hear the sound 104, as played back through the speaker 16, even when such a sound is not being generated within the arena 12. A user may choose to play back any of the stored recordings repeatedly, for example, during practice of timed events, so the horse 106 may become accustomed to hearing various arena sounds 104 while participating in such events. A horse 106 that is accustomed to hearing the arena sounds 104 is better prepared to participate in timed events without being distracted or spooked by hearing such arena sounds during competition.

Figure 3:
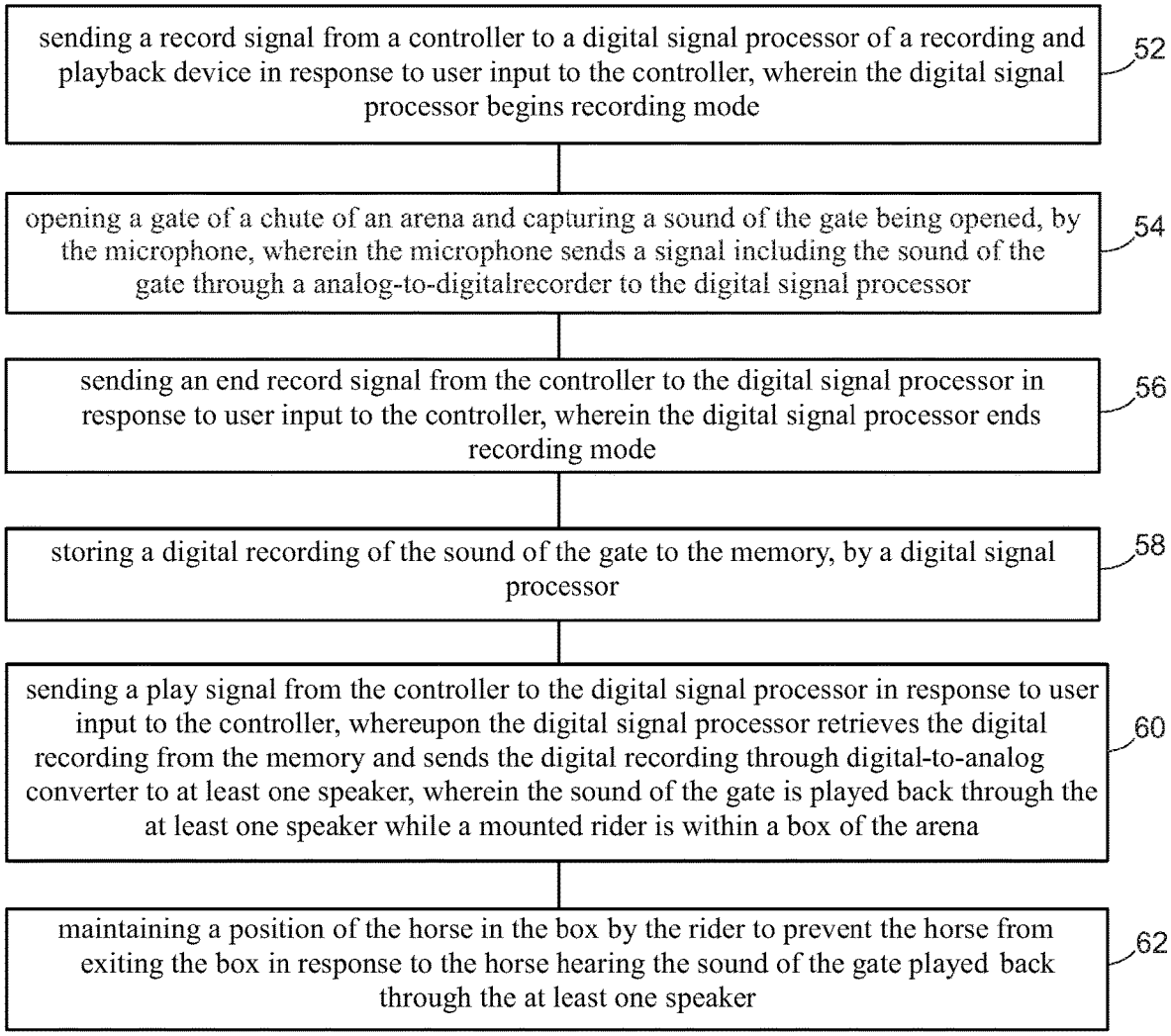
FIG. 3 is a method of use of a system for acclimating a horse to the sound of the opening of an arena chute gate in accordance with an embodiment.

FIG. 3 is a block diagram of a method 50 of using a system for acclimating a horse to the sound of the opening of an arena chute gate, the method 50 comprising: sending a record signal from a controller to a digital signal processor of a recording and playback device in response to user input to the controller, wherein the digital signal processor begins recording mode [Step 52]; opening a gate of an arena chute, whereby the sound of the gate being opened is captured by the microphone, whereupon the microphone sends a signal including the sound of the gate through the analog-to-digital recorder to the digital signal processor [Step 54]; sending an end record signal from the controller to the digital signal processor in response to user input to the controller, wherein the digital signal processor ends recording mode [Step 56]; storing the digital recording to the memory by the digital signal processor [Step 58]; sending a play signal from the controller to the digital signal processor in response to user input to the controller, whereupon the digital signal processor retrieves the digital recording from the memory and sends the digital recording through the digital-to-analog converter to at least one speaker, wherein the audio recording is played back through the at least one speaker while a mounted rider is within a box of the arena [Step 60]; and maintaining the position of the horse in the box by the rider to prevent the horse from exiting the box in response to the horse hearing the sound of the gate played back through the at least one speaker. [Step 62].

In some embodiments, the method may further comprise additional steps of: controlling the sensitivity of the microphone through user input to the controller; controlling the volume of the at least one speaker through user input to the controller; selecting a sound to be played back from a list of various recorded sounds saved to the memory; and repeating playback of the sound at a spaced timed interval that is pre-programmed to the DSP or selected by the user.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire-line, optical fiber cable, RF, etc., or any suitable combination of the foregoing.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the DSP 34. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that some of the blocks of the flowchart illustrations and/or block diagrams, or some combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, cloud-based infrastructure architecture, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. In such embodiments, the controller 18 may be coupled to a cloud-based infrastructure having the DSP 34 and the controller 18 would send the converted analog to digital signal to the cloud-based infrastructure for processing and storing a digital recording. Further, controller 18 may then request playback of the digital recording and the DSP 34 processes the digital recording and sends the digital signal to the digital to analog converter to convert to an analog signal that can then be broadcast through speakers.

The flowchart and block diagrams in the Figures illustrate the architecture, functionality, and operation of possible implementations of systems, methods and computer program products according to various embodiments of the present invention. In this regard, some blocks in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A method of using a system for acclimating a horse to a sound of the opening of an arena chute gate comprising:
    sending a record signal from a controller to a digital signal processor of a recording and playback device in response to user input to the controller, wherein the digital signal processor begins recording mode;
    opening a gate of an arena chute and capturing a sound of the gate being opened, by the microphone, wherein the microphone sends a signal including the sound of the gate through an analog-to-digital recorder to the digital signal processor;
    sending an end record signal from the controller to the digital signal processor in response to user input to the controller, wherein the digital signal processor ends recording mode;
    storing a digital recording of the sound of the gate to a memory, by the digital signal processor;
    sending a play signal from the controller to the digital signal processor in response to user input to the controller, whereupon the digital signal processor retrieves the digital recording from the memory and sends the digital recording through a digital-to-analog converter to at least one speaker, wherein the sound of the gate is played back through the at least one speaker while a mounted rider is within a box of the arena; and
    maintaining the position of the horse in the box by the rider to prevent the horse from exiting the box in response to the horse hearing the sound of the gate played-back through the at least one speaker.

2. The method of claim 1, further comprising controlling sensitivity of the microphone through user input to the controller.

3. The method of claim 1, further comprising controlling volume of the at least one speaker through user input to the controller.

4. The method of claim 1, further comprising selecting a sound to be played back from a list of recorded sounds saved to the memory.

5. The method of claim 1, further comprising repeating playback of the sound, by the digital signal processor, at spaced timed intervals.

\* \* \* \* \*